(12) United States Patent
Savelli et al.

(10) Patent No.: US 9,301,423 B2
(45) Date of Patent: Mar. 29, 2016

(54) COOLING DEVICE EQUIPPED WITH A THERMOELECTRIC SENSOR

(75) Inventors: Guillaume Savelli, Grenoble (FR); Philippe Coronel, Barraux (FR)

(73) Assignee: COMMISSARIAT À L'ENERGIE ATOMIQUE ET AUX ENERGIES ALTERNATIVES, Paris (FR)

( * ) Notice: Subject to any disclaimer, the term of this patent is extended or adjusted under 35 U.S.C. 154(b) by 252 days.

(21) Appl. No.: 14/236,722

(22) PCT Filed: Jul. 30, 2012

(86) PCT No.: PCT/FR2012/000319
§ 371 (c)(1), (2), (4) Date: Feb. 3, 2014

(87) PCT Pub. No.: WO2013/017750
PCT Pub. Date: Feb. 7, 2013

(65) Prior Publication Data
US 2014/0233186 A1 Aug. 21, 2014

(30) Foreign Application Priority Data
Aug. 2, 2011 (FR) .................... 11 02425

(51) Int. Cl.
H01L 23/473 (2006.01)
H05K 7/20 (2006.01)
H01L 23/34 (2006.01)
H01L 23/373 (2006.01)
H01L 23/38 (2006.01)
H01L 23/46 (2006.01)

(52) U.S. Cl.
CPC ............ *H05K 7/20281* (2013.01); *H01L 23/34* (2013.01); *H01L 23/3737* (2013.01); *H01L 23/38* (2013.01); *H01L 23/46* (2013.01); *H01L 23/473* (2013.01); *H01L 2924/0002* (2013.01)

(58) Field of Classification Search
CPC . H01L 23/38; H05K 7/20281; H05K 7/20518
See application file for complete search history.

(56) References Cited

U.S. PATENT DOCUMENTS

| 3,807,489 | A | 4/1974 | Minbiole et al. |
| 5,966,940 | A | 10/1999 | Gower et al. |
| 6,388,186 | B1 * | 5/2002 | Nomura .................... G01J 5/12 136/224 |
| 6,711,904 | B1 | 3/2004 | Law et al. |
| 8,829,639 | B2 * | 9/2014 | Remondiere .......... G01K 7/028 257/467 |

(Continued)

OTHER PUBLICATIONS

Aldrete-Vidrio et al, Differential Temperature Sensors Fully Compatible With a 0.35-um CMOS Process, IEEE Transactions on Components and Packaging Technologies, vol. 30, No. 4, Dec. 2007.*

(Continued)

*Primary Examiner* — Robert J Hoffberg
(74) *Attorney, Agent, or Firm* — Oliff PLC

(57) ABSTRACT

A cooling device of a component includes at least one channel in which a first cooling fluid flows designed to cool a hot area of the component. It further includes a thermoelectric module configured to measure a temperature difference between the hot area of the component and the channel, and a control circuit configured to modulate the flowrate of the first cooling fluid in the channel according to the temperature difference.

7 Claims, 3 Drawing Sheets

(56) References Cited

U.S. PATENT DOCUMENTS

| | | | |
|---|---|---|---|
| 9,054,272 B2* | 6/2015 | Savelli | H01L 35/32 |
| 2006/0180300 A1 | 8/2006 | Lenehan et al. | |
| 2008/0168775 A1* | 7/2008 | Windheim | F25B 21/02 |
| | | | 62/3.7 |
| 2008/0229759 A1* | 9/2008 | Ouyang | H01L 23/38 |
| | | | 62/3.3 |
| 2008/0264464 A1* | 10/2008 | Lee | A61F 7/007 |
| | | | 136/201 |
| 2009/0200007 A1 | 8/2009 | Foy et al. | |
| 2010/0155047 A1 | 6/2010 | Lin et al. | |
| 2010/0290188 A1 | 11/2010 | Brunschwiler et al. | |
| 2014/0036951 A1* | 2/2014 | Caroff | G01K 7/02 |
| | | | 374/29 |
| 2014/0092935 A1* | 4/2014 | Lin | G01N 25/48 |
| | | | 374/10 |

OTHER PUBLICATIONS

Prakash et al., "Microfluidic Bubble Logic," Science, Feb. 2007, vol. 315, pp. 832-835.

Lahann et al., "A Reversibly Switching Surface," Science, Jan. 2003, vol. 299, pp. 371-374.

Sun et al., "Reversible Switching between Superhydrophilicity and Superhydrophobicity," Angewandte Chemie, Jan. 2004, vol. 43, pp. 357-360.

Siriwatwechakul et al., "Thermo-Sensitive Hydrogel; Control of Hydrophilic-Hydrophobic Transition," World Academy of Science, Engineering and Technology, Jan. 2008, vol. 47, pp. 429-434.

Oct. 19, 2012 International Search Report issued in International Application No. PCT/FR2012/000319.

Translation of Oct. 19, 2012 Written Opinion issued in International Patent Application No. PCT/FR2012/000319.

* cited by examiner

COOLING DEVICE EQUIPPED WITH A THERMOELECTRIC SENSOR

BACKGROUND OF THE INVENTION

The invention relates to thermal management of components, and more particularly to a cooling device provided with a flowing cooling fluid.

STATE OF THE ART

Massive integration of components in electronic systems inevitably gives rise to the problem of cooling. Indeed, the larger the number of components in a given volume, the more the electronic system heats and the greater the risk of damage arising due to overheating.

Different cooling solutions exist. Passive cooling devices use a heat sink or thermal vias to remove the heat from the components to the outside. The use of a heat sink is constraining for integration of the electronic system in an appliance of small size such as a mobile phone for example. High-performance thermal vias, for example made from carbon nanotubes, are difficult to fabricate and complexify the architecture of the system.

The passive devices can be associated with air ventilation in order to improve the cooling performances. When natural or forced air convection is no longer sufficient to remove the energy dissipated by the system, flow of a cooling fluid has to be used.

FIG. 1 schematically represents an electronic system cooled by flow of a cooling fluid, as described in US Patent application 2010/0290188.

The electronic system is formed by a stack of integrated circuits 2. The stack is fixed to a printed circuit 4 by means of welding beads 6. Circuits 2 are interconnected by metal vias 8 formed in silicon bumps 10.

The integrated circuits 2 of the stack are spaced apart from one another by means of interconnection bumps 10. These separations enable flow of a cooling fluid 12. Fluid 12 also flows between the top circuit 2 and a wall of an enclosure 14 acting as confinement structure for the fluid. Enclosure 14 comprises an inlet opening 16a and an outlet opening 16b of the cooling fluid, arranged on each side of the stack. The flow of fluid 12, generated by a pump, thereby flows in contact with circuits 2 from one end of enclosure 14 to the other.

In this type of system, control of the cooling fluid flowrate is performed by the pump. The flowrate is generally set to a high value to ensure maximum cooling whatever the thermal conditions of the system. This control does not take account of the real cooling requirements at component level. The fluid consumption, and therefore the electric consumption of the pump, are not optimized.

SUMMARY OF THE INVENTION

It is observed that a requirement exists to provide a device enabling optimized cooling while at the same time having a low electric and fluid consumption.

This requirement tends to be met by providing a cooling device of a component comprising at least one channel in which a first cooling fluid flows designed to cool a hot area of the component. The device comprises a thermoelectric module configured to measure the temperature difference between the hot area of the component and the channel, and a control circuit configured to modulate the flowrate of the first cooling fluid in the channel according to the temperature difference.

In a preferred embodiment, the surface of the channel in contact with the first cooling fluid is covered by a layer of polymer material presenting a first surface energy under a first excitation condition and a second surface energy under a second excitation condition, the first and second excitation conditions being fixed by the control circuit.

According to a development, the polymer material layer is a self-assembled monolayer comprising particles of mercapto-hexadecanoic acid and the thermoelectric module is configured to apply a temperature variation to the self-assembled monolayer representative of the first and second excitation conditions.

According to another development, the polymer material layer comprises isopropylacrylamide monomers and the control circuit is configured to apply an electric potential variation to the polymer material layer representative of the first and second excitation conditions.

BRIEF DESCRIPTION OF THE DRAWINGS

Other advantages and features will become more clearly apparent from the following description of particular embodiments given for non-restrictive example purposes only and illustrated by means of the appended drawings, in which.

DESCRIPTION OF A PREFERRED EMBODIMENT OF THE INVENTION

In order to optimize the cooling fluid flowrate in a cooling circuit, a thermoelectric sensor is fitted between the cooling circuit and a hot area of a component to be cooled. This sensor measures the characteristics of the thermal environment of the component, in particular the temperature difference between the component and the cooling fluid. The sensor is connected to a control circuit which regulates the cooling fluid flowrate according to this temperature difference. The fluid flowrate is thus continuously adjusted to the cooling requirements of the component.

Figure 1:
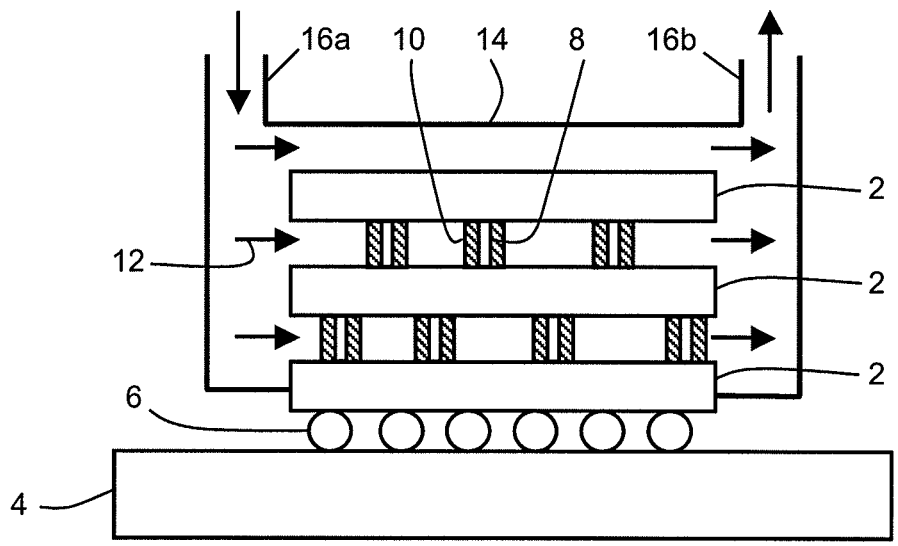
FIG. 1, described in the foregoing, represents a conventional electronic system cooling device.
Figure 2:
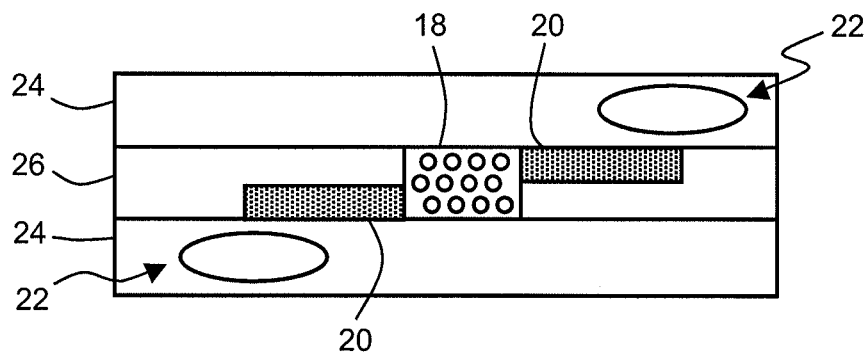
FIG. 2 represents an embodiment of a cooling device according to the invention.

FIG. 2 represents an embodiment of a cooling device provided with a thermoelectric module.

The cooling device comprises a cooling circuit 18 and a thermoelectric module 20 arranged between circuit 18 and a hot area 22 of the component. Cooling circuit 18 comprises at least one channel or heat pipe in which the cooling fluid flows. Circuit 18 is advantageously formed by a network of channels.

A first end of module 20 is in thermal contact with the channel network 18, forming a cold source, and a second end is in thermal contact with hot source 22. Thermoelectric module 20 is thus subjected to a temperature difference at its ends. It is further electrically connected to a control circuit (not represented in FIG. 2).

In this embodiment, the cooling device is integrated in the component to be cooled. For illustration purposes, the component is formed by a stack of integrated circuits 24, each integrated circuit having a hot area 22. Integrated circuits 24 are conventionally separated by an interconnection layer 26 containing metal vias. These vias electrically connect integrated circuits 24. Cooling circuit 18 and thermoelectric module 20 are preferably formed in interconnection layer 26.

As represented in FIG. 2, the same channel network 18 can participate in cooling several hot areas 22, each area 22 being separated from network 18 by a thermoelectric module.

The cooling device advantageously comprises several cooling circuits and several thermoelectric modules arranged in different levels of the stack. It is then possible to cool each integrated circuit of the stack individually. The cooling circuits can be independent or connected to form a single cooling fluid distribution network.

The cooling fluid is a gas or a liquid at a lower temperature than that of the component in the hot area. It is preferably chosen from water, nitrogen and an alcohol.

Figure 3:
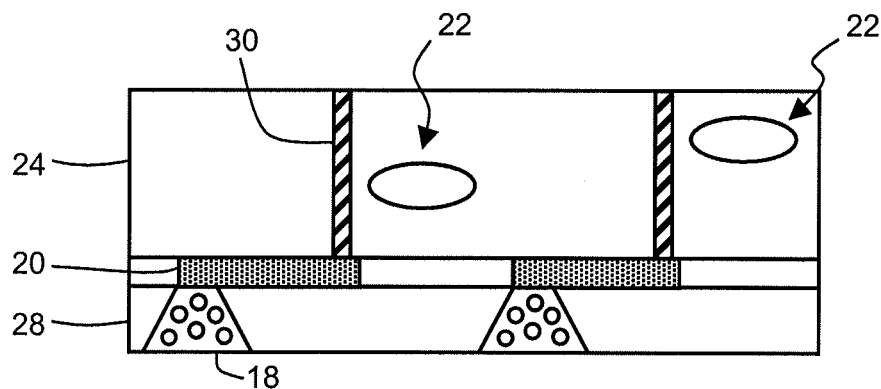
FIG. 3 represents an alternative embodiment of a cooling device according to the invention.

FIG. 3 represents an alternative embodiment of a cooling device in which the cooling circuit is located remotely from the component.

The device comprises a cooling layer 28 in which channels 18 are formed, and at least one thermoelectric module 20 formed on layer 28. At least one component 24 to be cooled is arranged overlying layer 28 and module 20.

In the example of FIG. 3, component 24 comprises two hot points 22, each being associated with a set of channels 18 and a module 20. One end of each module 20 is in thermal contact with channels 18. The other end is in thermal contact with a hot point 22, preferably by means of a thermal via 30 (also called thermal bridge).

Thermal vias 30 are formed by a material having a high thermal conductivity, preferably higher than the thermal conductivity of the material forming component 24. Vias 30 are for example formed by a metal. In this case, vias 30 can perform electric connection of thermoelectric modules 20 with the control circuit, located for example above component 24 or on the same substrate as that of component 24.

Layer 28 constitutes a support in which the fluid circuit is formed. This support is for example made from silicon and can further be used to form the control circuit. Layer 28 can also be formed from a heat-insulating material such as glass.

In this configuration, a cooling layer 28, covered by thermoelectric modules 20, can serve the purpose of cooling several stacked components 24. As will be described further on, this variant of the cooling device is particularly simple to implement. The cooling device and component can be fabricated separately and the component then be fitted onto the cooling device.

Figure 4:
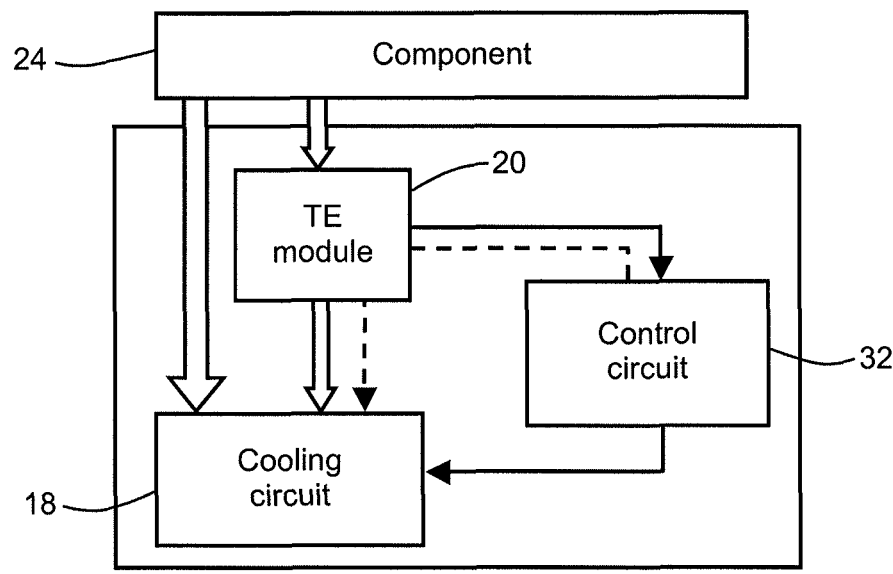
FIG. 4 represents a block diagram of a cooling device according to the invention.

FIG. 4 represents a block diagram of the cooling device of FIGS. 2 and 3, connected to a component 24. The black arrows represent the electric signals received and sent by the different elements of the device whereas the white arrows represent the heat flux.

Thermoelectric module 20 (TE) measures the temperature difference between component 24 and cooling circuit 18. An electric signal representative of this difference, for example the voltage at the ends of module 20, is transmitted to control circuit 32. Control circuit 32 controls cooling circuit 18 so as to modify the cooling fluid flow according to the temperature difference.

The heat of the component is for a large part removed by channel network 18. This heat transfer is performed by thermal conduction of the different layers separating hot area 22 and channel network 18.

Thermoelectric module 20 also participates in cooling of the component. A part of the heat flux does in fact pass through the thermoelectric material from hot source 22 to cold source 18. This transfer is however limited on account of the small volume occupied by the thermoelectric module and the low thermal conductivity of the materials forming the latter.

Control circuit 32 comprises for example a measurement signal amplifier on output from thermoelectric sensor 20, a processing algorithm in the form of a microprocessor and a control signal generating circuit. When several thermoelectric modules are used, the control circuit receives and processes all the measurement signals, for example simultaneously.

Figure 5:
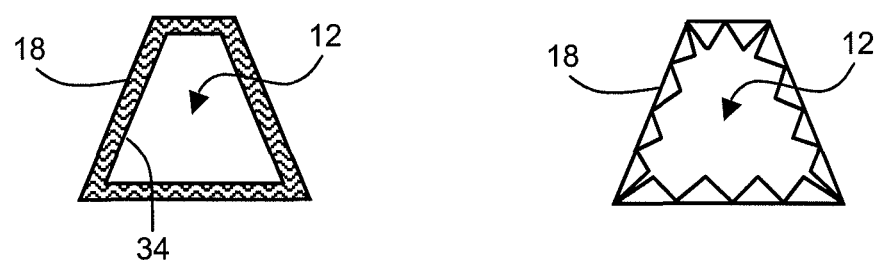
FIG. 5 represents different configurations of a cooling circuit used in the cooling device according to the invention.

FIG. 5 represents examples of a cooling circuit enabling the cooling fluid flowrate to be modulated. In these examples, the cooling circuit has been simplified: it is formed by a single channel 18 of trapezoid cross-section.

In a preferred embodiment, the flowrate of cooling fluid 12 is adjusted by making the surface energy between channel 18 and fluid 12 vary. For this, the surface of the channel in contact with the fluid is covered by a polymer material layer 34.

The control circuit sends an electric or thermal stimulus to layer 34. The latter modifies the internal structure of polymer layer 34 and therefore its surface energy. In the case of water as cooling fluid, this in fact involves modifying the wettability of the surface of the channel, i.e. its hydrophilic or hydrophobic nature.

In other words, control circuit 32 defines excitation conditions to make polymer layer 34 change from a first state to a second state, the surface energy of the polymer being different in the two states.

The polymer layer is for example a self-assembled monolayer (SAM) as described in the article "Reversible Switching between Superhydrophilicity and Superhydrophobicity" (Ta-olei et al., Angew. Chem. Int., 43, 357-360, 2004). It comprises molecules of mercapto-hexadecanoic acid (MHA). Depending on whether a positive or negative electric potential is applied on the channel, the polymer layer presents a hydrophobic or hydrophilic nature.

Alternatively, the polymer layer comprises N-isopropylacrylamide (PNIPAM) monomers, described in the article "A reversible switching surface". These monomers are temperature-sensitive. The polymer layer becomes hydrophobic when it is heated above a given temperature of about 32° C. On the contrary, it becomes hydrophilic when it is cooled below this temperature.

Other types of molecules can be envisaged such as poly(n-substituted acrylamide), poly(N-(L)-(1-hydroxymethyl) propylmethacrylamide) (P(L-HMPMAAm)), and poly(N-acryloyl-NO-alkylpiperazine). These examples of polymers react to thermal stimuli.

Certain of these molecules graft onto a particular type of surface to form a self-assembled monolayer SAM. Channel 18 is then formed in a material enabling grafting of the molecules used, for example gold in the case of MHA molecules.

It is thus possible to control the flowrate in the cooling circuit by modifying the properties of the polymer material layer. A surface rendered hydrophobic will limit water circulation by reducing the cross-section of the channel. On the contrary, a channel having a hydrophilic surface enhances water circulation and therefore increases the flowrate.

The electric stimulus is preferably transmitted by the thermoelectric module to the polymer layer. The thermoelectric module is electrically connected to the control circuit. The control circuit can therefore send an electric signal to the polymer layer via the thermoelectric module (arrow in broken lines in FIG. 4).

The module further directly removes a part of the heat flux to the cooling circuit. This heat transfer can therefore serve the purpose of locally modifying the structure of the polymer layer. In other words, the thermoelectric module, in direct contact with the channel, transmits the thermal information causing modification of the polymer layer.

The surface of channel 18 covered by polymer material depends on the maximum flowrate variation envisaged. For example purposes, if it is desired to completely interrupt flow of the cooling fluid, polymer layer 34 will be able to be deposited on the whole surface of the channel 18 (FIG. 5). The fluid will then be directed to another branch of the cooling circuit to remove the heat from another component. The polymer material can be deposited on a single wall of channel 18 when it is desired to make the flowrate vary to a lesser extent.

Polymer layer 34 is preferably deposited on channel 18 in the vicinity of thermoelectric module 20. It can also be arranged upstream or downstream from the thermoelectric module in the direction of flow of the fluid. An additional thermal or electric conductor, distinct from the thermoelectric module, is then provided to convey the associated signal.

As represented on the right in FIG. 5, the surface of channel 18 in contact with fluid 12 is advantageously structured in order to perform a more precise control of the surface energy.

The cooling device described above enables use of a closed cooling circuit 18. Indeed, by modifying the surface energy locally in several consecutive areas of the circuit 18, it is possible to create a movement of the cooling fluid. A closed circuit is particularly interesting for mobile applications. A pump is then in fact no longer necessary to force circulation of the cooling fluid, which represents both a gain in consumption and a saving of space.

Control circuit 32 can also control an inlet valve connected to an additional cooling fluid tank. This second cooling fluid preferably presents a different thermal capacity from that of the first fluid. Thus, when the second fluid is inlet to circuit 18, it increases or reduces the cooling power (or calorific value) of the first cooling fluid.

In one embodiment, the two fluids are chosen to trigger an endothermic reaction when they are mixed. They are preferably conveyed by different channels and then mixed in the thermoelectric module. The article "Microfluidic Bubble Logic" (M. Prakash et al, Science, Vol. 315, pp. 832-835, February 2007) describes an example of a fluidic system enabling such mixing to be performed.

It can also be envisaged to use a cooling fluid containing polar molecules and to apply an electric field to direct these molecules.

Figure 6:
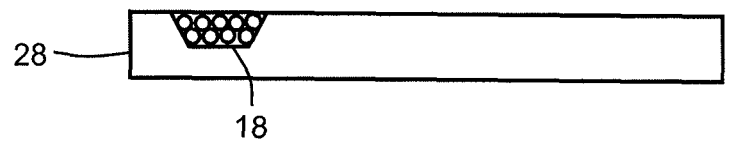
FIGS. 6 to 8 represent steps of fabrication of a cooling device according to FIG. 3.
Figure 7A:
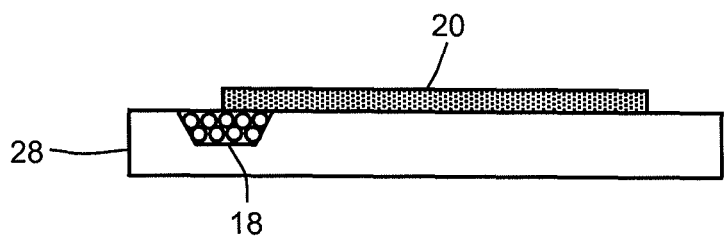
Figure 7B:
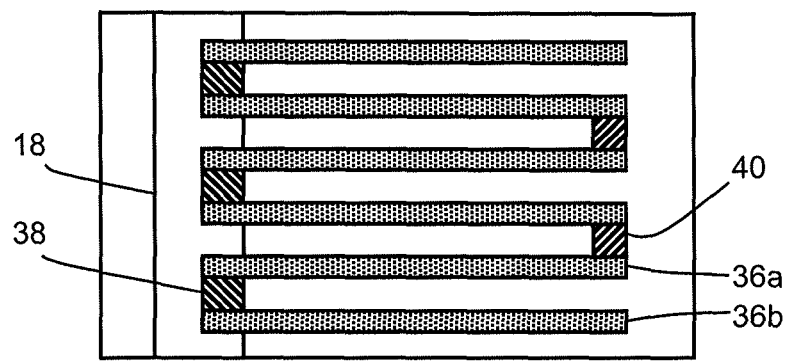
Figure 8:
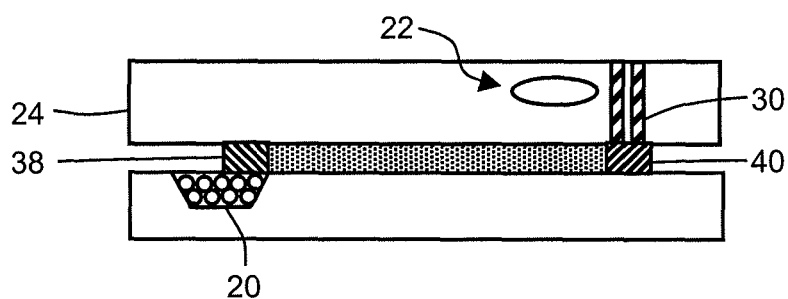

FIGS. 6 to 8 represents steps of a fabrication method of a cooling device according to FIG. 3.

The step of FIG. 6 correspond to formation of cooling layer 28 containing channels 18. The channels are preferably etched in a silicon substrate. They have for example a cylindrical shape and a diameter comprised between 10 μm and 1 mm. The surface of channels 18 in contact with the cooling fluid may be covered by a thin layer of gold, aluminium or titanium, with a thickness of 10 nm to 100 μm, before the polymer material is deposited thereon. The thickness of the polymer layer varies between 10 nm and 1 μm.

In the step of FIG. 7A, the thermoelectric module 20 is formed on the surface of cooling layer 28. One end of module 20 is arranged in contact with channels 18.

As represented in top view in FIG. 7B, thermoelectric module 20 is advantageously formed by a plurality of thermocouples. Each thermocouple comprises two thermoelectric studs 36a and 36b connected to one another at their ends by an internal metallic connector 38. The thermocouples are electrically connected in series by means of metallic link connectors 40.

Studs 36a and 36b have different thermoelectric natures. For example, stud 36a is made from P-type silicon and stud 36b is made from N-type silicon. Other semiconductor or semi-metal materials can be envisaged, such as germanium, bismuth, antimony and their alloys. Studs 36a and 36b are preferably of identical dimensions. Their thickness is for example comprised between 5 nm and 500 μm depending on the fabrication method used.

Component 24 is then stuck onto cooling device (FIG. 8). It preferably comprises metal vias 30 designed to conduct heat from hot area 22, situated inside the component, to thermoelectric module 20.

Link connectors 40 are in contact with metal vias 30 in individual manner so as not to form a short-circuit. Internal connectors 36 are arranged on channels 18. The thermocouples are thus arranged in parallel between a hot source formed by the component and a cold source formed by channels 18.

As heat is progressively removed from the component, the (cold) temperature of the cooling fluid increases. Flowrate regulation (and/or modulation of the thermal capacity of the fluid), performed by the control circuit, does however enable the temperature of the cold source to be maintained at a suitable value. The signal delivered by the thermoelectric sensor therefore, at all times, reflects the thermal conditions in which the component is.

The thermoelectric module enables the variation of the temperature of the component to be monitored and the cooling fluid flowrate and inlet to be adjusted in real time. The fluid consumption can then be limited to the requirements of the component. As the fluid flowrate is generally imposed by a pump, this represents a saving in electric power. Furthermore, the thermoelectric module does not consume any current on account of the fact that it operates as a temperature sensor and not in Peltier mode. A cooling device having a lower electric consumption than those of conventional active devices is then obtained.

For mobile applications, a closed cooling circuit will be preferred, i.e. a circuit without a pump. The electric consumption of the cooling device will then be minimal and will correspond to that of the control circuit.

The invention claimed is:

1. A cooling device of a component comprising: at least one channel in which a first cooling fluid flows designed to cool a hot area of the component, comprising:
   a thermoelectric module configured to measure a temperature difference between the hot area of the component and the at least one channel, a thermoelectric module comprising a P-type semiconductor material and a N-type semiconductor material, a first portion of the P-type semiconductor material and a first portion the N-type semiconductor material are adjacent the hot area of the component, and a second portion of the P-type semiconductor material and a second portion the N-type semiconductor material are adjacent the at least one channel; and
   a control circuit configured to modulate a flowrate of the first cooling fluid in the at least one channel according to the temperature difference.

2. The device according to claim 1 wherein a surface of the at least one channel in contact with the first cooling fluid is covered by a polymer material layer presenting a first surface energy under a first excitation condition and a second surface energy under a second excitation condition, the first and second excitation conditions being fixed by the control circuit.

3. The device according to claim 2 wherein the polymer material layer is a self-assembled monolayer comprising particles of mercapto-hexadecanoic acid and wherein the thermoelectric module is configured to apply a temperature variation to the self-assembled monolayer representative of the first and second excitation conditions.

4. The device according to claim 2 wherein the polymer material layer comprises isopropylacrylamide monomers and wherein the control circuit is configured to apply an electric potential variation to the polymer material layer representative of the first and second excitation conditions.

5. The device according to claim 1 comprising a tank of a second cooling fluid having a different thermal capacity from that of the first cooling fluid, and an inlet valve of the second cooling fluid to the channel controlled by the control circuit.

6. The device according to claim 1 wherein the thermoelectric module is formed by a plurality of thermocouples electrically connected in series and thermally connected in parallel between the hot area of the component and the at least one channel.

7. The device according to claim 1 wherein the at least one channel comprises a plurality of channels.

* * * * *